United States Patent
Micovic et al.

(10) Patent No.: US 7,695,564 B1
(45) Date of Patent: Apr. 13, 2010

(54) THERMAL MANAGEMENT SUBSTRATE

(75) Inventors: Miroslav Micovic, Thousand Oaks, CA (US); Peter Deelman, Calabasas, CA (US); Yakov Royter, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 641 days.

(21) Appl. No.: 11/051,749

(22) Filed: Feb. 3, 2005

(51) Int. Cl.
C30B 25/02 (2006.01)

(52) U.S. Cl. .............................. 117/95; 117/9; 117/92; 117/97; 117/103; 117/108; 438/423; 438/480; 438/766; 438/514; 438/516; 257/E21.005; 257/E21.041; 257/E21.049; 257/E21.095; 257/E21.096

(58) Field of Classification Search .................. 257/66, 257/70, 288, E21.005, E21.041, E21.049, 257/E21.095, E21.096; 438/516, 526, 528, 438/149, 423, 480, 514, 766; 117/89, 288, 117/9, 92, 95, 97, 103, 108; 437/62, 86, 437/126; 428/833, 833.1, 833.2, 835
See application file for complete search history.

(56) References Cited

U.S. PATENT DOCUMENTS

| | | | | |
|---|---|---|---|---|
| 5,064,809 | A * | 11/1991 | Hed | 505/329 |
| 5,171,732 | A * | 12/1992 | Hed | 505/190 |
| 5,328,761 | A * | 7/1994 | Omori et al. | 428/336 |
| 5,376,579 | A | 12/1994 | Annamalai | |
| 5,391,510 | A * | 2/1995 | Hsu et al. | 438/301 |
| 5,782,975 | A | 7/1998 | Linn | |
| 5,952,060 | A * | 9/1999 | Ravi | 427/577 |
| 6,046,758 | A * | 4/2000 | Brown et al. | 347/203 |
| 6,091,437 | A * | 7/2000 | Yoneda et al. | 347/203 |
| 6,193,585 | B1 * | 2/2001 | Tanabe et al. | 451/41 |
| 6,316,329 | B1 * | 11/2001 | Hirota et al. | 438/424 |
| 6,428,399 | B1 * | 8/2002 | Tanabe et al. | 451/66 |
| 6,737,793 | B2 * | 5/2004 | Pehrsson et al. | 313/311 |
| 6,812,473 | B1 * | 11/2004 | Amemiya | 250/492.22 |
| 6,866,730 | B2 * | 3/2005 | Cheng et al. | 148/516 |
| 2001/0020878 | A1 * | 9/2001 | Speidell et al. | 333/197 |
| 2002/0093039 | A1 * | 7/2002 | Coolbaugh et al. | 257/213 |
| 2003/0010749 | A1 * | 1/2003 | Yoshizawa et al. | 216/56 |

(Continued)

OTHER PUBLICATIONS

Simox, Julian Blake, Encyclopedia of Physical Science and Technology, Third Edition, vol. 14, pp. 805-813, Academic Press, 2002.

(Continued)

*Primary Examiner*—Eric Hug
*Assistant Examiner*—Seyed Masoud Malekzadeh
(74) *Attorney, Agent, or Firm*—Tope-McKay & Assoc.

(57) ABSTRACT

The present invention is directed to a method for fabricating a thermal management substrate having a Silicon (Si) layer on a polycrystalline diamond film, or on a diamond-like-carbon (DLC) film. The method comprises acts of fabricating a separation by implantation of oxygen (SIMOX) wafer; depositing a polycrystalline diamond film onto the SIMOX wafer; and removing various layers of the SIMOX wafer to leave a Si overlay layer that is epitaxially fused with the polycrystalline diamond film. In the case of the DLC film, the method comprises acts of ion-implanting a Si wafer; depositing an amorphous DLC film onto the Si wafer; and removing various layers of the Si wafer to leave a Si overlay structure epitaxially fused with the DLC film.

4 Claims, 3 Drawing Sheets

U.S. PATENT DOCUMENTS

2003/0186453 A1* 10/2003 Bell et al. .................... 436/147
2005/0054130 A1* 3/2005 Leon et al. .................... 438/31
2005/0089317 A1* 4/2005 Mizukawa et al. .......... 392/407
2005/0205930 A1* 9/2005 Williams .................... 257/347
2006/0019464 A1* 1/2006 Maa et al. .................... 438/458
2006/0078999 A1* 4/2006 Bell et al. .................... 436/147
2006/0172467 A1* 8/2006 Lee et al. .................... 438/149

OTHER PUBLICATIONS

M. Bruel, "Silicon on Insulator Material Technology," electronics Letters vol. 31, pp. 1201-1202, 1995.

* cited by examiner

THERMAL MANAGEMENT SUBSTRATE

BACKGROUND OF THE INVENTION (1) Field of Invention

The present invention relates to a process used for fabricating Si-on-diamond or on diamond-like-carbon (DLC) wafers, and more particularly, Si-on-diamond or on DLC wafers that can be used as thermal management substrates.

(2) Description of Related Art

Silicon (Si) wafers have long been used as substrates for fabricating circuits, such as Ultra Large Scale of Integration (ULSI) circuits. The Si wafers have typically been homogeneous Si monocrystalline wafers and separation by implantation of oxygen (SIMOX) wafers.

High speed ULSI Complimentary Metal Oxide Semiconductor (CMOS) digital Integrated Circuits (ICs) generate more heat per unit chip area as levels of integration and clock rates are increased. Heat management is currently one of the major considerations in designs of ULSI digital ICs. Effective heat management will become increasingly more important as IC integration starts expanding into a third dimension. The efficiency with which heat is dissipated from digital ICs is currently limited by thermal conductance properties of the Si substrate. A solution for solving heat management problems would be to fabricate Silicon based ICs on a substance with increased thermal conductor, such as diamond. The heat conductance of diamond of 20 W/(cmK) is higher than that of Silicon by a factor of 13.

There are several patents issued that are related to Silicon-on-diamond technology. U.S. Pat. No. 5,376,579, issued to Annamalai (hereinafter referred to as "The Annamalai Patent"), describes a process for fabricating Si-on-diamond substrates. However, the The Annamalai Patent, describes Si-on-diamond substrates being bonded to a carrier wafer, because they do not posses sufficient mechanical strength to survive normal handling. U.S. Pat. No. 5,782,975, issued to Linn (hereinafter referred to as "The Linn Patent"), describes a method for fabricating Si-on-diamond substrates by bonding of chemical vapor deposition (CVD) diamond to Silicon. However, the thermal contact between the Si and the diamond substrate taught by The Linn Patent does not provide for sufficient thermal contact because the two layers are not epitaxially fused together.

Thus, a continuing need exists for a fabrication process that forms a Si structure epitaxially fused to a diamond, or to a (diamond-like-carbon) substrate to increase thermal contact and that can used as a thermal management substrate.

SUMMARY OF INVENTION

The present invention relates to fabricating a thermal management substrate. In one aspect, the method comprises acts of fabricating a separation by implantation of oxygen (SIMOX) wafer by ion-implantation; the SIMOX wafer including a Si wafer, a Si overlay structure, and a buried oxide (BOX) layer between the Si wafer and the Si overlay structure; depositing a polycrystalline diamond film onto the Si overlay structure and opposite the BOX layer, to form a composite wafer; removing the Si wafer; polishing the polycrystalline diamond film to improve wafer flatness and surface finish; removing the BOX layer, whereby the thermal management substrate comprises an Si overlay layer that is epitaxially fused with the polycrystalline diamond film.

The method further comprises an act of polishing the Si overlay layer by chemical mechanical polishing to improve flatness and surface finish.

In another aspect, in the act of depositing the polycrystalline diamond film, the diamond film is deposited using a technique selected from a group consisting of chemical vapor deposition (CVD) and plasma enhanced chemical vapor deposition (PECVD).

Furthermore, in the act of depositing the polycrystalline diamond film, the diamond film is deposited at a substrate temperature in a range of approximately 900° C. and 1100° C.

In yet another aspect, in the act of polishing the polycrystalline diamond film, the polycrystalline diamond film is mechanically polished to improve wafer flatness and surface finish.

In the act of removing the BOX layer, the BOX layer is removed through immersing the BOX layer, Si overlay structure, and polycrystalline diamond film into a solution selected from Hydrofluoric Acid and Buffer Oide Etch.

In another aspect, in the act of removing the Si wafer, the Si wafer is removed by immersing the composite wafer into a solution selected from a group consisting of Hydrofluoric Acid and Buffer Oxide Etch to selectively dissolve the BOX layer and separate the Si wafer from the Si overlay structure and polycrystalline diamond film.

In yet another aspect, in the act of removing the Si wafer, the Si wafer is removed by immersing the composite wafer into a wet etching solution, where the wet etching solution selectively etches Si, leaving the BOX layer and the diamond film intact.

In another aspect, in the act of removing the Si wafer, the Si wafer is removed by lapping and polishing the Si wafer to a thickness of 10 μm to 50 μm, with any remaining Si wafer being removed by a wet etching technique that selectively etches Si at a rate substantially greater than it does the BOX layer and the diamond film.

In yet another aspect, in the act of removing the Si wafer, the Si wafer is removed by lapping and polishing the Si wafer to a thickness of 10 μm to 50 μm, with any remaining Si wafer being removed by a dry etching technique that uses a solution selected from a group consisting of a chlorine based plasma chemistry and a bromine-based plasma chemistry.

In another aspect, the method comprises acts of ion-implanting a Si wafer to form an ion-implanted wafer, the ion-implanted wafer comprising a Si substrate layer, a Si overlay structure, and a ion-implanted layer between the Si substrate layer and the Si overlay structure; depositing an amorphous diamond-like-carbon (DLC) film onto the Si overlay structure and opposite the ion-implanted layer, forming a composite structure; removing the Si substrate layer; polishing the DLC film to improve flatness and surface finish; and polishing the Si overlay structure to improve flatness and surface finish, whereby the remaining thermal management substrate is a Si overlay structure epitaxially fused with a DLC film.

In the act of depositing the amorphous diamond-like-carbon (DLC) film, the diamond film is deposited using a technique selected from a group consisting of chemical vapor deposition (CVD) and plasma enhanced chemical vapor deposition (PECVD).

In the act of removing the Si substrate layer, the Si substrate layer is removing by thermally annealing the composite structure to cause ion-induced micro-cracks to form and thereby causing layer splitting.

Additionally, in the act of polishing the DLC film, the DLC film is polished to improve wafer flatness and surface finish.

Furthermore, in the act of polishing the Si overlay structure, the Si overlay structure is polished through chemical mechanical polishing.

Finally, it can be appreciated by one in the art that the present invention also comprises thermal management substrates formed through the methods described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
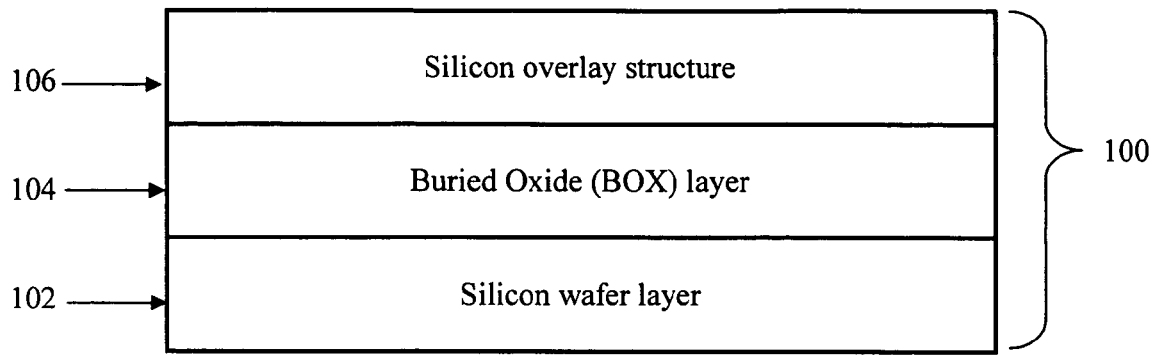
FIG. 1 is a cross-sectional view of a SIMOX wafer, the SIMOX wafer comprising a Silicon (Si) wafer, a $SiO_2$ buried oxide (BOX) layer, and a Si overlay structure.

The present invention relates to a process used for fabricating Si-on-diamond or on diamond-like-carbon (DLC) wafers, and more particularly, Si-on-diamond or on DLC wafers that can be used as thermal management substrates. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first an introduction is provided to provide the reader with a general understanding of the present invention. Next, a discussion of various aspects of the present invention is provided to give an understanding of the specific details. Finally, non-limiting examples of applications of the thermal management substrate are provided to further illustrate the utility of the present invention.

(1) Introduction

The present invention discloses a method for fabricating thin monocrystalline Silicon (Si) films on large-diameter polycrystalline diamond or on amorphous diamond-like-carbon (DLC) wafers, to form a thermal management substrate. The composite Si-on-diamond or on DLC wafers fabricated by the present invention are well suited for fabricating products where heat dispersion is important by providing at least an order of magnitude improvement in thermal conductance over existing substrates.

To achieve effective heat management, the distance between the diamond (or DLC) substrate and an attached device (e.g., such as Ultra Large Scale of Integration (ULSI) digital Integrated Circuits (IC)), where the heat is generated, should be kept as small as physically possible. The best way to keep the distance between the device and the diamond substrate to a minimum would to fabricate the device on a few microns to a few tenths of a micron thick monocrystalline Si film, which is epitaxially fused to a diamond or DLC wafer. The present invention describes an innovative process for epitaxially fusing the Si film with the diamond or DLC wafer to form the thermal management substrate.

(2) Description

The present invention provides methods for fabricating large area Silicon (Si) on diamond, or on amorphous diamond-like-carbon (DLC) wafers. For clarity, subsection (a) describes the process for fabricating large area Si-on-diamond wafers, while subsection (b) describes the process for fabricating large area Si on DLC wafers.

(a) Fabricating Large Area Silicon on Diamond Wafers.

The process for fabricating large area Silicon (Si) on diamond wafers comprises the following acts.

(i) Fabricating a Separation by Implantation of Oxygen (SIMOX) Wafer through Ion-Implantation.

The SIMOX wafer is formed through a SIMOX process (i.e., separation by implantation of oxygen). A $SiO_2$ buried oxide (BOX) layer is formed in a single crystal Si wafer by ion-implantation of oxygen at an elevated implantation temperature, thereby forming the SIMOX wafer with three layers. As shown in FIG. 1, the SIMOX wafer 100 comprises a Si wafer 102, a BOX layer 104 with a thickness of approximately 100 nm to 200 nm, and a Si overlay structure 106 with a thickness of approximately 50 nm and 500 nm. The elevated implantation temperature is a temperature suitable for ion-implantation of oxygen, generally between temperature ranges of approximately 500° C. to 600° C. The Si wafer is subsequently heated to between approximately 1300° C. to 1400° C. to anneal out damage in the Si overlay structure and improve flatness and quality of the BOX layer.

(ii) Chemical Vapor Deposition of Diamond onto the SIMOX Wafer.

Figure 2:
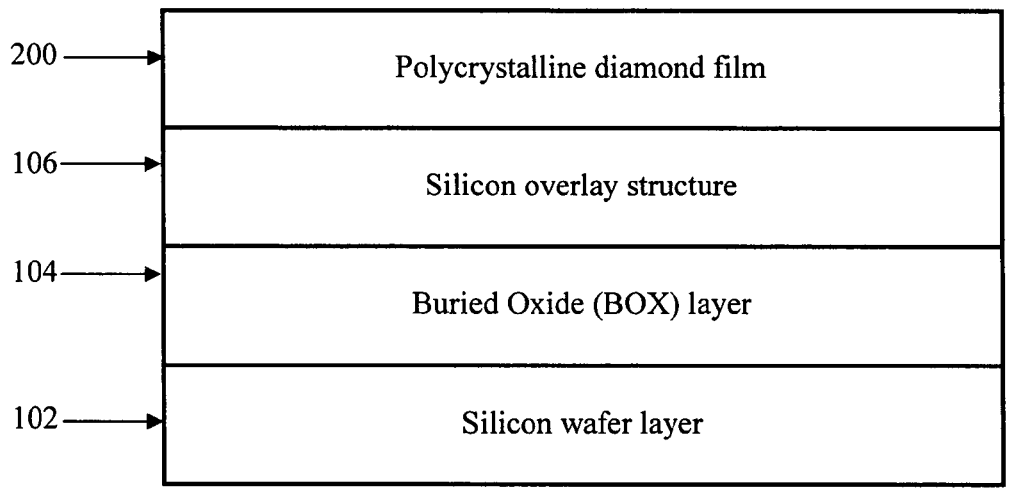
FIG. 2 is a cross-sectional view of a polycrystalline diamond film deposited onto the SIMOX wafer.

Using commercially available reactors, and as shown in FIG. 2, a polycrystalline diamond film 200 is deposited onto the SIMOX wafer 100 through deposition techniques such as Chemical Vapor Deposition (CVD) and Plasma Enhanced Chemical Vapor Deposition (PECVD). During deposition, the polycrystalline diamond film 200 is grown to a thickness of approximately 200 μm to 1500 μm. A typical growth rate for deposition of high quality diamond films is 3 μm per hour with a thermal conductivity of 20 W/(cmK). Higher deposition rates up to 6 μm per hour have been demonstrated, but at a cost of lower thermal conductivity (10 W/(cmK)) of the resulting diamond layers. The CVD and PECVD diamond films are grown at a substrate temperature of approximately 1000° C.

(iii) Removal of the Si Wafer.

Figure 3:
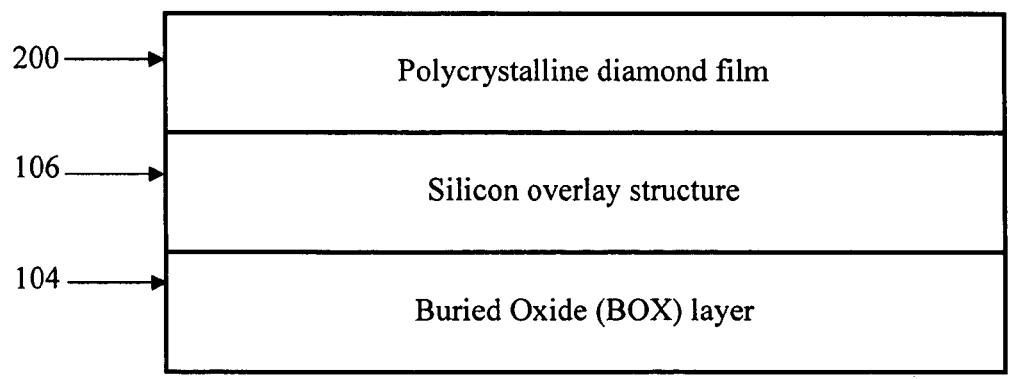
FIG. 3 is a cross-sectional view of a composite structure after the Si wafer has been removed, the composite structure comprising the BOX layer, the Si overlay structure, and the polycrystalline diamond film.

As shown in FIG. 3, the Si wafer 102 is removed to leave a remaining composite structure that comprises the BOX layer 104, the Si overlay structure 106, and the polycrystalline diamond film layer 102. The Si wafer 102 can be removed through many suitable techniques. Following are several exemplary Si wafer removal techniques.

Method 1: The composite structure shown in FIG. 2 is immersed into a solution, such as Hydrofluoric Acid or Buffer Oxide Etch, to selectively dissolve the BOX layer 104 and separate the Si wafer 102 from the remaining Si overlay structure 106 and diamond film 200.

Method 2: The composite structure shown in FIG. 2 is immersed into a wet etching solution, which etches Si, but does not etch $SiO_2$ and diamond. The effect of the etching is that the Si wafer 102 is etched way, leaving the BOX layer 104, the Si overlay structure 106, and the diamond film layer 200.

Method 3: The Si wafer 102 shown in FIG. 2 is lapped and polished to a thickness of 10 μm to 50 μM. The remainder of the Si 102 wafer is removed by a suitable wet etching technique that selectively etches Si at a substantially greater rate than it etches $SiO_2$ (e.g., BOX layer) or diamond, a non-limiting example of which includes a tetramethylammonium hydroxide etch (TMAH). The TMAH solution etches Si at an etch rate of 1 μm per minute, while it etches $SiO_2$ at an etch rate of 1 nm per minute.

Method 4: The Si wafer 102 shown in FIG. 2 is lapped and polished to a thickness of 10 μm to 50 μm. The remainder of the Si wafer 102 is removed by dry etching in chlorine or bromine-based plasma chemistry. Chlorine and bromine-based plasma chemistries are preferred for this operation because they do not affect the underlying BOX layer 105 in the same manner as they affect the Si wafer 102.

(iv) Polishing the Polycrystalline Diamond Film.

The polycrystalline diamond film 200 (i.e., as grown by CVD or PECVD) has a rough surface and a variation in thickness uniformity. To improve wafer flatness and to obtain the smooth and uniform surface finish required for wafer processing, the polycrystalline diamond film 200 is mechanically polished using a suitable diamond film polishing technique. It should be note that operation (iv) can be performed before operation (iii).

(v) Removal of the $SiO_2$ BOX Layer and CMP Polish of the Si Overlay Structure.

Figure 4:
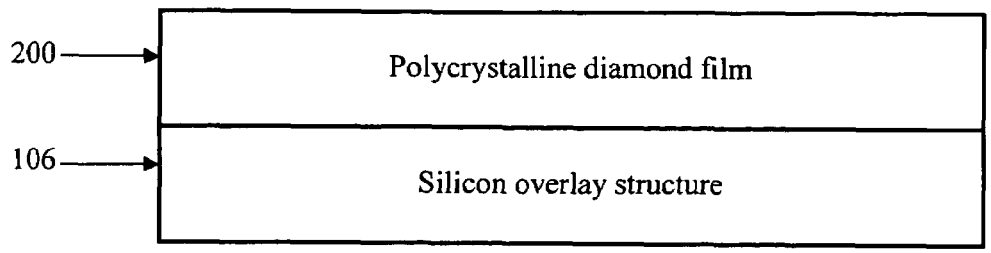
FIG. 4 is a cross-sectional view of a thermal management substrate according to the present invention after the BOX layer has been removed, the thermal management substrate comprising a Si overlay layer epitaxially fused to the polycrystalline diamond film.

The $SiO_2$ BOX layer is removed by immersing the composite wafer shown in FIG. 3 into an etching solution such as Hydrofluoric Acid or Buffer Oxide Etch. As shown in FIG. 4, the Si overlay layer 106 remains fused to the diamond film 200. To obtain a surface finish that is required for fabricating ULSI ICs, the Si overlay layer 106 of FIG. 4 is polished through a suitable polishing technique, such as through Chemical Mechanical Polishing (CMP). Through CMP, the Si overlay layer 106 can be thinned down to a thickness of approximately 50 nm, which is the thickness required for fabricating fully depleted CMOS circuits. As shown in FIG. 4, the finished Si-on-diamond substrate consists of approximately a 50 nm to 200 nm thick monocrystalline Si film, which is epitaxially fused to an approximately 300 μm to 1500 μm thick polycrystalline (CVD or PECVD) diamond substrate.

(b) Fabricating Large Area Si-on-Diamond-Like-Carbon (DLC) Wafers.

In this section, an alternate process for fabricating large area Si-on-diamond-like-carbon (DLC) wafers is described. The process described in this section is less suited for fabricating Si-on-diamond, because the process is not compatible with temperatures that are required for deposition of polycrystalline diamond.

DLC is an amorphous carbon material in which carbon atoms are bonded by a mixture of sp2 (i.e., graphite like) and sp3 (i.e., diamond like) atomic bonds. The DLC is a highly insulating material with excellent thermal conductivity (10 W/(cmK)). Through commercially available CVD reactors, the DLC films can be deposited at a substrate temperature of approximately 300° C. and at deposition rates of up to approximately 20 μm/hour. The Si on DLC wafers can be produced by the process as described in previous section for fabricating Si-on-diamond. The only difference between the two processes would be in CVD deposition act, where DLC films are deposited at lower temperatures in a different reactor. The alternate process for fabricating Si on DLC wafers comprises the following acts.

(i) Fabricating a Si Overlay Layer by Blistering of Ion-Implanted Si.

Figure 5:
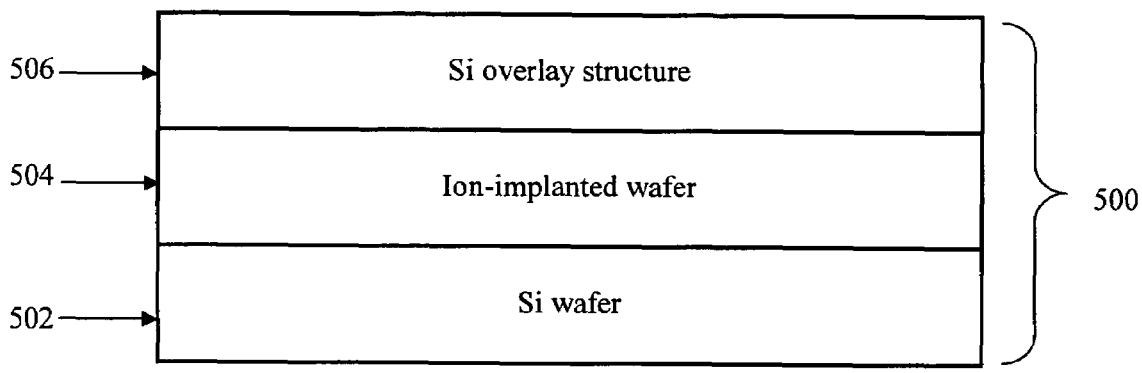
FIG. 5 is cross-sectional view of an ion-implanted wafer, showing a Si wafer, an ion-implanted layer, and a Si overlay structure layer.

In 1995, an article published by M. Bruel in *Electronics Letters*, Vol. 31, pages 1201 through 1202, entitled, "Silicon on Insulator Material Technology," reported the Smart-Cut™ process. The Smart-Cut process is used to split a 50 nm to 200 nm thick Si layer from a full thickness Si wafer. The ion cut process is divided into several stages: 1) ion-implantation of hydrogen (H) or helium (He) atoms into a Si wafer; 2) bonding of the implanted wafer to a handle wafer; and 3) splitting of the implanted wafer upon thermal annealing of the bonded par. In this section, a similar process is used to fabricate Si on DLC films. The starting substrate for fabricating Si on a DLC wafers is a Si wafer implanted by hydrogen to a dose of approximately $2.5 \times 10^{16}$ $cm^2$ to $5 \times 10^{16}$ $cm^2$, which is typical for the Smart-Cut™ process. The implantation energy is chosen so that the H peak is located between approximately 200 nm to 500 nm below the Si wafer surface. FIG. 5 illustrates a cross-section of an ion-implanted wafer 500, showing three layers; the first layer being a Si wafer 502; the second layer being an ion-implanted layer 504; and the third layer being a Si overlay structure layer 506 with a thickness between approximately 50 nm to 500 nm. The three layers collectively being an ion-implanted wafer 500. Additionally, the ion-implanted layer 504 includes either Helium or Hydrogen, depending upon which ion was initially used to implant the starting substrate wafer.

(ii) Deposition of DLC onto the Ion-Implanted Wafer.

Figure 6:
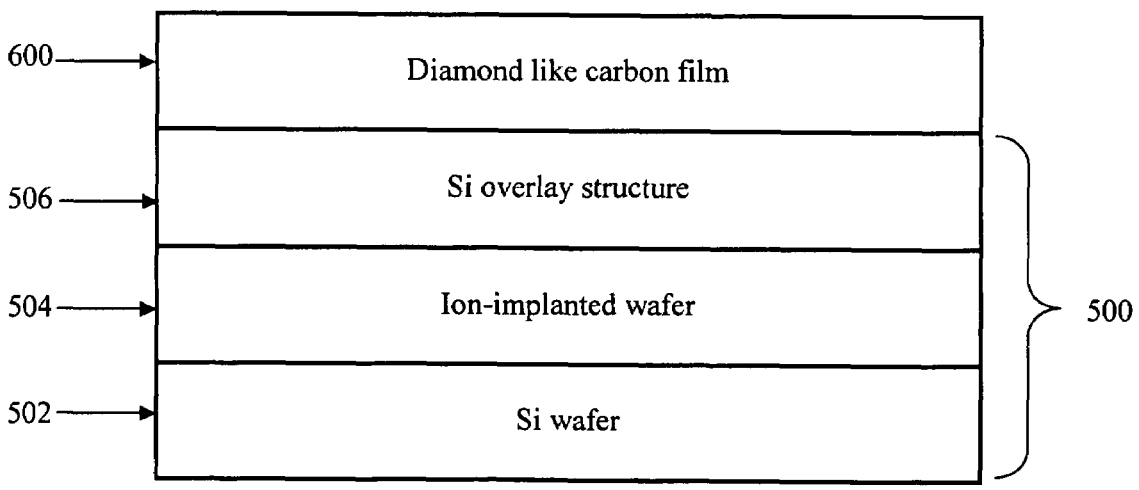
FIG. 6 is a cross-sectional view of an amorphous diamond-like-carbon (DLC) film deposited onto the ion-implanted wafer.

As shown in FIG. 6, an amorphous DLC film 600 is deposited onto the ion-implanted wafer 500 through a suitable deposition technique such as Chemical Vapor Deposition (CVD) and Plasma Enhanced Chemical Vapor Deposition (PECVD). Using commercially available reactors for CVD and PECVD, the DLC film 600 shown in FIG. 6 is grown to a thickness between approximately 200 μm to 1500 μM.

Although deposition rates as high as 20 μm per hour have been reported, typical growth rate for deposition of high quality DLC is a few per hour (with a thermal conductivity of 10 W/(cmK)). The CVD and PECVD DLC films are grown at substrate temperatures between approximately 300° C. and 350° C.

(iii) Polishing the DLC Film.

The thick DLC film 600 (i.e., as grown by CVD or PECVD) has a rough surface and a variation in thickness uniformity. To improve wafer flatness and to obtain a smooth and uniform surface finish, as required for wafer processing, the DLC film 600 is mechanically polished using a suitable DLC film polishing technique.

(iv) Removal of the Si Wafer.

The Si wafer 502 is removed by thermally annealing the wafer at a temperature range between approximately 350° C. and 600° C. The thermal annealing causes layer splitting in the ion-implanted wafer 504 where ion-induced micro-cracks were formed, resulting in wafer separation. The remaining composite, shown in FIG. 7, comprises the DLC film 600 attached with the Si overlay structure 506. It should be noted that operation (iv) can be performed before operation (iii).

(v) CMP Polish of the Si Overlay Structure.

Figure 7:
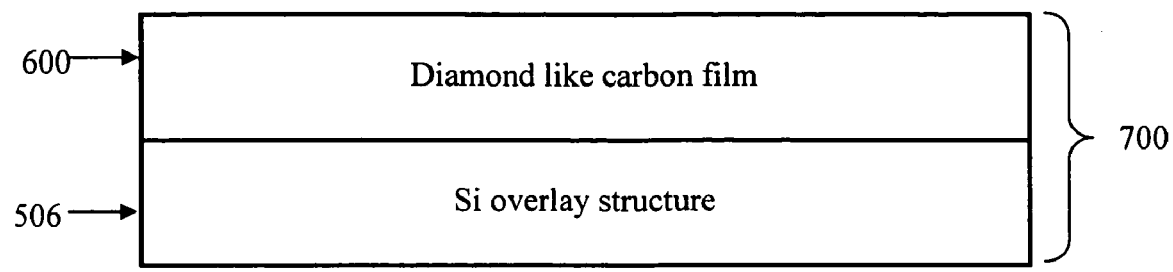
FIG. 7 is a cross-sectional view of a thermal management substrate according to the present invention, the thermal management substrate comprising a monocrystalline Si film epitaxially fused to a DLC substrate.

The Si overlay structure 506 is polished through a polishing technique that results in a surface finish that is suitable for fabricating ULSI ICs, a non-limiting example of which includes Chemical Mechanical Polishing (CMP). Through CMP, the Si overlay structure 506 can be thinned down to a thickness of approximately 50 nm, which is the thickness required for fabricating fully depleted complementary metal oxide semiconductor (CMOS) circuits. The CMP act is the last act in the process for fabricating Si on DLC substrates. FIG. 7 shows a schematic cross section of the resulting thermal management substrate 700 according to the present invention. The thermal management substrate comprises an approximately 50 nm to 200 nm thick monocrystalline Si film 506, which is epitaxially fused to an approximately 200 μm to 500 μm thick amorphous DLC substrate 600.

(3) Exemplary Applications

As previously mentioned, the composite Si-on-diamond or on DLC wafers fabricated by the present invention are well-suited for fabricating products where heat dispersion is important. Circuits fabricated on wide-band gap diamond substrates will have higher radiation hardness than those fabricated on Si, and will be better suited for a variety of applications. For example, the thermal management substrate can be used for fabricating Si based integrated circuits, including Ultra Large Scale of Integration (ULSI) digital Integrated Circuits (IC) and Si Germanium (Ge) Bi-Complimentary Metal Oxide Semiconductor (CMOS) circuits. As another non-limiting example, the thermal management substrate can be used for fabricating high-power radio-frequency (RF) GaN Heterojunction Field Effect Transistors (HFETs). The thermal management substrates according to the present invention enable the fabrication of denser and faster ICs than existing substrates because they solve the problem of thermal management at higher clock rates and higher integration levels.

What is claimed is:

1. A method for fabricating a thermal management substrate, the method comprising acts of:
    ion-implanting a Si wafer to form an ion-implanted wafer, the ion-implanted wafer comprising a Si substrate layer, a Si overlay structure, and an ion-implanted layer between the Si substrate layer and the Si overlay structure;
    depositing an amorphous diamond-like-carbon (DLC) film to a thickness of greater than 200 μm onto the Si overlay structure and opposite the ion-implanted layer, forming a composite structure;
    removing the Si substrate layer by thermally annealing the composite structure to cause ion-induced micro-cracks to form and thereby causing layer splitting;
    polishing the DLC film; and
    polishing the Si overlay structure, whereby the remaining thermal management substrate is a Si overlay structure epitaxially fused with a DLC film.

2. A method for fabricating a thermal management substrate as set forth in claim 1, wherein in the act of depositing the amorphous diamond-like-carbon (DLC) film, the diamond film is deposited using a technique selected from a group consisting of chemical vapor deposition (CVD) and plasma enhanced chemical vapor deposition (PECVD).

3. A method for fabricating a thermal management substrate as set forth in claim 1, wherein in the act of polishing the DLC film, the DLC film is polished through mechanical polishing.

4. A method for fabricating a thermal management substrate as set forth in claim 1, wherein in the act of polishing the Si overlay structure, the Si overlay structure is polished through chemical mechanical polishing.

\* \* \* \* \*